United States Patent
Ou et al.

(10) Patent No.: US 10,290,773 B2
(45) Date of Patent: May 14, 2019

(54) LIGHT-EMITTING DEVICE (75) Inventors: Chen Ou, Hsinchu (TW); Liang Sheng Chi, Hsinchu (TW); Chun Wei Chang, Hsinchu (TW); Chih-Wei Wu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 272 days.

(21) Appl. No.: 13/614,405

(22) Filed: Sep. 13, 2012

(65) Prior Publication Data

US 2014/0070258 A1 Mar. 13, 2014

(51) Int. Cl.
*H01L 33/08* (2010.01)
*H01L 33/42* (2010.01)
*H01L 33/14* (2010.01)
*H01L 33/38* (2010.01)

(52) U.S. Cl.
CPC .............. *H01L 33/42* (2013.01); *H01L 33/08* (2013.01); *H01L 33/14* (2013.01); *H01L 33/38* (2013.01)

(58) Field of Classification Search
CPC ....................................................... H01L 33/08
USPC ........................................... 257/99, E33.064
See application file for complete search history.

(56) References Cited

U.S. PATENT DOCUMENTS

| | | | |
|---|---|---|---|
| 2002/0093023 A1* | 7/2002 | Camras | H01L 33/02 257/94 |
| 2011/0062459 A1* | 3/2011 | Kal | H01L 27/156 257/88 |
| 2011/0163346 A1* | 7/2011 | Seo et al. | 257/99 |
| 2012/0001223 A1* | 1/2012 | Inoue et al. | 257/103 |
| 2012/0112159 A1* | 5/2012 | Komada | H01L 33/305 257/13 |

FOREIGN PATENT DOCUMENTS

CN    100349305 C    11/2007
WO    WO 2011083551 A1 *  7/2011

OTHER PUBLICATIONS

Machine translation of Zhang et al., CN 100349305 C, Nov. 14, 2007.*

* cited by examiner

*Primary Examiner* — Hsin Yi Hsieh
(74) *Attorney, Agent, or Firm* — Patterson + Sheridan, LLP (57) ABSTRACT

A light-emitting device is disclosed and comprises: a substrate; a light-emitting stack comprising a first conductivity type semiconductor layer, an active layer over the first conductivity type semiconductor layer, and a second conductivity type semiconductor layer over the active layer; a transparent conductive layer over the a light-emitting stack; a first trench dividing the transparent conductive layer into a first block and a second block; a connecting layer electrically connecting the two blocks of the transparent conductive layer; a first conductivity type contact layer between the substrate and the first conductivity type semiconductor layer, wherein the conductivity of the first conductivity type contact layer is greater than the conductivity of the first conductivity type semiconductor layer.

19 Claims, 6 Drawing Sheets

LIGHT-EMITTING DEVICE

TECHNICAL FIELD

The application relates to a light-emitting device, in particular to a light-emitting diode with uniform light emission.

DESCRIPTION OF BACKGROUND ART

A light-emitting diode (LED) is known for its high energy efficiency and is introduced to various fields of use. The theory for a light-emitting diode (LED) to emit light is that when a forward voltage power is applied to a p-n junction, the electrons are driven from the n-type semiconductor and the holes are driven from the p-type semiconductor, and these carriers are combined in the active layer to emit light. The efficiency of an LED depends on the combination rate of the electrons from the n-type semiconductor and the holes from the p-type semiconductor. However, due to the poor current spreading, especially in the p-type semiconductor, the efficiency is reduced. An electrode with an extending part such as a finger-type electrode is commonly used to improve the poor current spreading. In addition, a transparent conductive layer is disposed between the finger-type electrode and the p-type semiconductor as an ohmic contact layer to improve the current spreading.

Figure 1A:
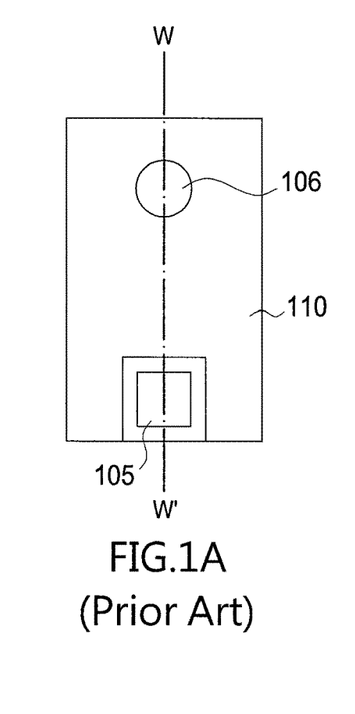
FIG. 1A is the top view.
Figure 1B:
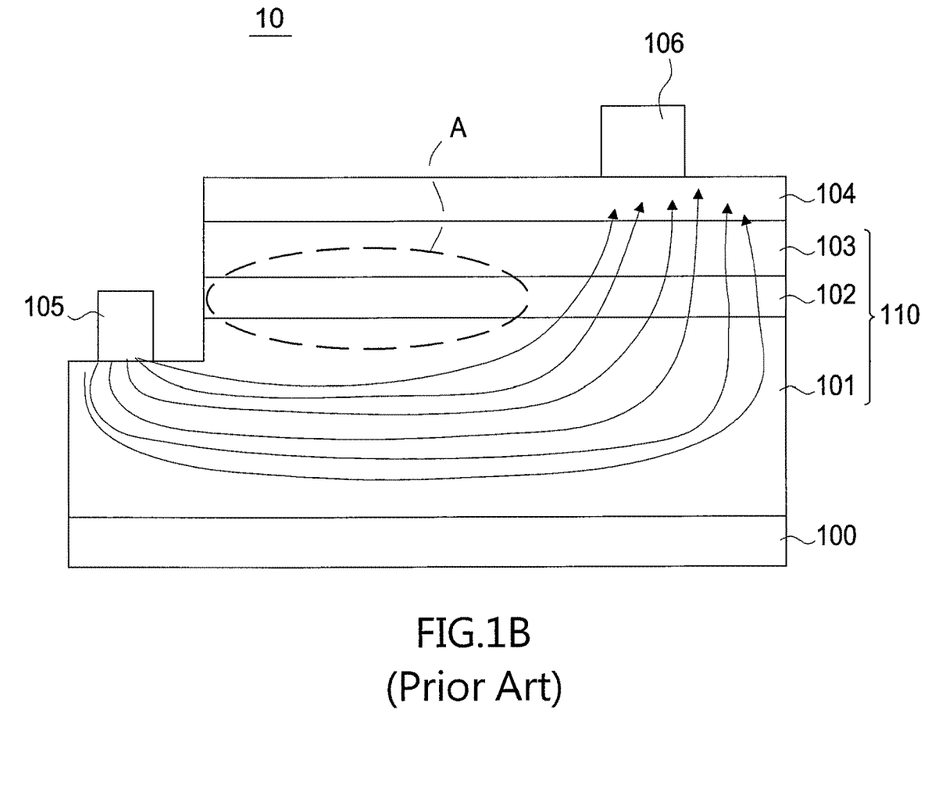
FIG. 1B is the cross-sectional view along the line W-W'.

FIG. 1 is a schematic structure diagram of a conventional light-emitting diode without the finger-type p-electrode. FIG. 1A is the top view, and FIG. 1B is the cross-sectional view along the line W-W'. As shown in FIG. 1, a conventional light-emitting device 10 comprises a substrate 100, a light-emitting stack 110, a transparent conductive layer 104, and two electrodes 105, 106. The light-emitting stack 110 comprises a first conductivity type semiconductor layer 101, a second conductivity type semiconductor layer 103, and an active layer 102 between the first conductivity type semiconductor layer 101 and the second conductivity type semiconductor layer 103. For example, the first conductivity type semiconductor layer 101 is n-type, and the second conductivity type semiconductor layer 103 is p-type. The first electrode 105 is electrically connected to the first conductivity type semiconductor layer 101, and the second electrode 106 is electrically connected to the transparent conductive layer 104. When an external power source is supplied to the light-emitting device 10 from the two electrodes 105, 106, the condition of electrons flow (the reverse of the current/holes flow) from the first electrode 105 to the second electrode 106 is shown as the arrow lines indicate. As the second electrode 106 is not an electrode with an extending part, a current crowding phenomenon occurs and there is almost no electrons flow in the area A which is not under the second electrode 106. This phenomenon results in a non-uniform light emission and low luminous efficiency.

Figure 2A:
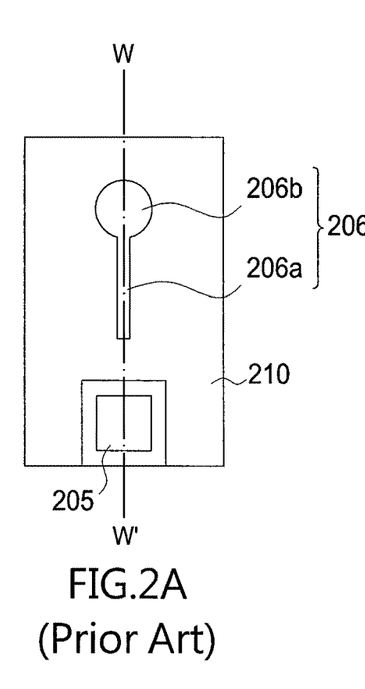
FIG. 2A is the top view.
Figure 2B:
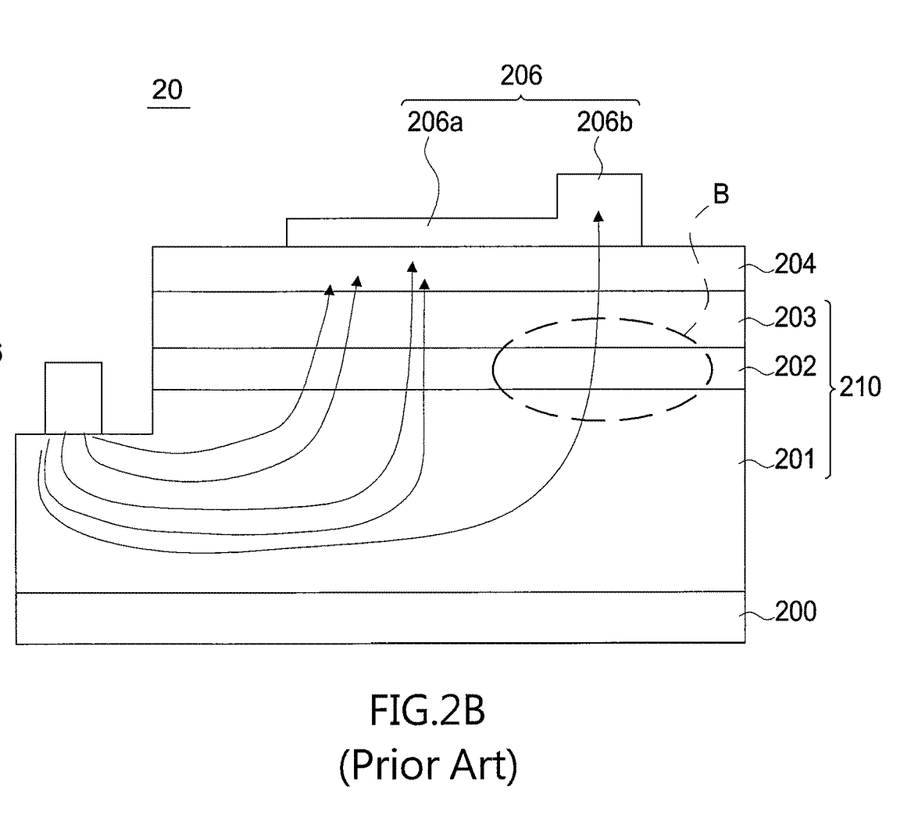
FIG. 2B is the cross-sectional view along the line W-W'.

To solve the problem described above, a conventional light-emitting diode with the finger-type p-electrode shown in FIG. 2 is provided. FIG. 2A is the top view, and FIG. 2B is the cross-sectional view along the line W-W'. The conventional light-emitting device 20 is substantially the same as the light-emitting device 10, except that the second electrode 206 is a finger-type electrode, which comprises an extending part 206a in addition to the main part 206b. Other elements, such as a substrate 200, a light-emitting stack 210, a first conductivity type semiconductor layer 201, an active layer 202, a second conductivity type semiconductor layer 203, and a transparent conductive layer 204, are the same as those shown in FIG. 1, and are not discussed again.

As illustrated in FIG. 2, the extending part 206a is introduced to solve the current crowding problem. When an external power source is supplied to the light-emitting device 20 from the two electrodes 205, 206, the condition of electrons flow (the reverse of the current/holes flow) from the first electrode 205 to the second electrode 206 is shown as the arrow lines indicate. Because the second electrode 206 is a finger-type electrode, the current/holes is(are) spread by the extending part 206a, and the deficiency which there is almost no electrons flow in the area A in FIG. 1 is improved. However, as shown in FIG. 2, it is observed that electrons flow in that area A is a majority part, and only a few of electrons flow through the area B in FIG. 2.

SUMMARY OF THE DISCLOSURE

A light-emitting device is disclosed and comprises: a substrate; a light-emitting stack comprising a first conductivity type semiconductor layer, an active layer over the first conductivity type semiconductor layer, and a second conductivity type semiconductor layer over the active layer; a transparent conductive layer over the a light-emitting stack; a first trench dividing the transparent conductive layer into a first block and a second block; a connecting layer electrically connecting the two blocks of the transparent conductive layer; a first conductivity type contact layer between the substrate and the first conductivity type semiconductor layer, wherein the conductivity of the first conductivity type contact layer is greater than the conductivity of the first conductivity type semiconductor layer.

BRIEF DESCRIPTION OF THE DRAWINGS

FIG. 1 is a schematic structure diagram of a conventional light-emitting diode without the finger-type electrode with the electrons flow.

FIG. 2 is a schematic structure diagram of a conventional light-emitting diode with the finger-type electrode with the electrons flow.

FIG. 3 is a schematic structure diagram of the light-emitting diode in accordance with the first embodiment of the present application.

FIG. 4 is a schematic structure diagram of the light-emitting diode in accordance with the second embodiment of the present application.

FIG. 5 is a schematic structure diagram of the light-emitting diode in accordance with the third embodiment of the present application.

DETAILED DESCRIPTION OF PREFERRED EMBODIMENTS

Figure 3A:
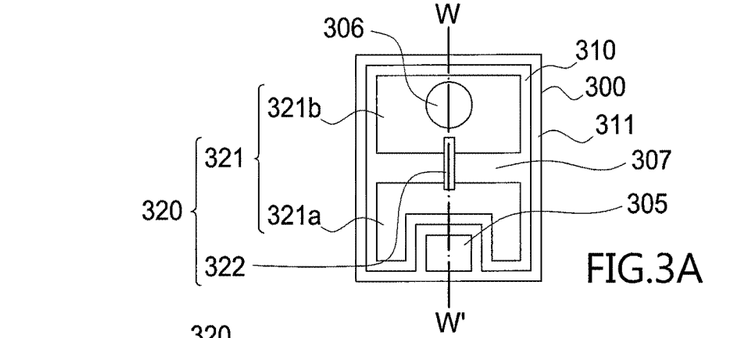
FIG. 3A is the top view.
Figure 3B:
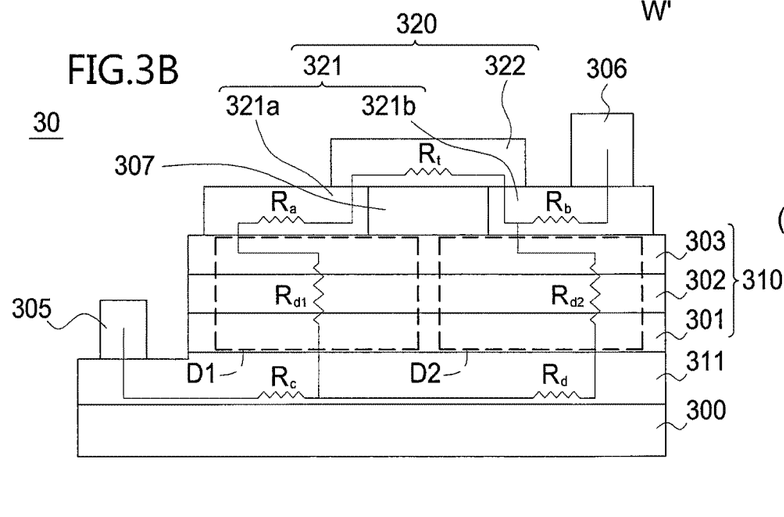
FIG. 3B is the cross-sectional view along the line W-W'.

FIG. 3 illustrates the first embodiment of present application. FIG. 3A is the schematic structure diagram in the top view, and FIG. 3B is the cross-sectional view along the line W-W'. The light-emitting device 30 comprises a substrate 300, a first conductivity type contact layer 311, a light-emitting stack 310, a conductive structure 320, and two electrodes 305, 306. The substrate 300 is a monolithic substrate and, for example, is a sapphire substrate. The light-emitting stack 310 comprises a first conductivity type semiconductor layer 301, a second conductivity type semiconductor layer 303, and an active layer 302 between the first conductivity type semiconductor layer 301 and the second conductivity type semiconductor layer 303. For example, in this embodiment the first conductivity type semiconductor layer 301 is n-type, and the second conductivity type semiconductor layer 303 is p-type. The light-emitting stack 310 is a stack of semiconductor layers which can be formed by conventional epitaxy technology with proper doping if necessary. For example, materials for each semiconductor layer is composition of $Al_xIn_yGa_{(1-x-y)}N$ ($0 \leq x \leq 1$, $0 \leq y \leq 1$, $0 \leq x+y \leq 1$).

The conductive structure 320 comprises a transparent conductive layer 321 of a first conductive material over the light-emitting stack 310, and a connecting layer 322 of a second conductive material. The transparent conductive layer 321 comprises a first block 321a and a second block 321b which is adjacent to but separated from the first block 321a by a first trench 307. That is, the first trench 307 divides the transparent conductive layer 321 into the first block 321a and the second block 321b. The first trench 307 may be formed by an etching process to remove the part between the first block 321a and the second block 321b of the transparent conductive layer 321. In this embodiment, a non-conductive material such as $SiN_x$, $SiO_x$, and SOG is further provided and fills the first trench 307. In this embodiment, the transparent conductive layer 321 may comprise a transparent conductive oxide layer, for example, ITO (Indium Tin Oxide), IZO (Indium Zinc Oxide), ZTO (Zinc Tin Oxide), AZO (Al-doped ZnO), GZO (Ga-doped ZnO), IGZO (Indium Gallium Zinc Oxide), CTO (Cadmium Stannate, $Cd_2SnO_4$), ZTO (Zinc Stannate, $Zn_2SnO_4$), and CIO (Cadmium Indate, $CdIn_2O_4$).

The connecting layer 322 over the transparent conductive layer 321 comprises a second conductive material and electrically connects the two blocks 321a and 321b of the transparent conductive layer 321. The second conductive material comprises conductivity which is different from that of first conductive material of the transparent conductive layer 321. Preferably, the second conductive material comprises conductivity greater than that of the first conductive material. For example, in this embodiment the connecting layer 322 may comprises a metal material, or metal alloy or a mixture thereof. The metal material may comprise copper (Cu), aluminum (Al), indium (In), tin (Sn), gold (Au), platinum (Pt), zinc (Zn), silver (Ag), titanium (Ti), lead (Pb), palladium (Pd), germanium (Ge), nickel (Ni), chromium (Cr), cadmium (Cd), and cobalt (Co). The first block 321a and the second block 321b of the transparent conductive layer 321 are electrically connected by the connecting layer 322 so that the first block 321a, the second block 321b, and the connecting layer 322 form a first current path.

The first conductivity type contact layer 311 is disposed between the substrate 300 and the first conductivity type semiconductor layer 301. The conductivity of the first conductivity type contact layer 311 is different from the conductivity of the first conductivity type semiconductor layer 301. In this embodiment, the conductivity of the first conductivity type contact layer 311 is greater than the conductivity of the first conductivity type semiconductor layer 301. For example, the conductivity of the first conductivity type contact layer 311 comprises the same material as that of the first conductivity type semiconductor layer 301, but has a higher impurity doping level than that of the first conductivity type semiconductor layer 301. In this embodiment, the first conductivity type semiconductor layer 301 is doped to a concentration of about $5 \times 10^{17}$ (atoms/cm$^3$), while the first conductivity type contact layer 311 is doped to a concentration of about $5 \times 10^{18}$ (atoms/cm$^3$). The first electrode 305 is electrically connected to the first conductivity type contact layer 311 to be electrically connected to the first conductivity type semiconductor layer 301, and the second electrode 306 is electrically connected to the conductive structure 320, or more specifically to the second block 321b of the transparent conductive layer 321 to be electrically connected to the second conductivity type semiconductor layer 303. The second electrode 306 may be formed simultaneously with the connecting layer 322. That is, the second electrode 306 comprises the second conductive material.

Figure 3C:
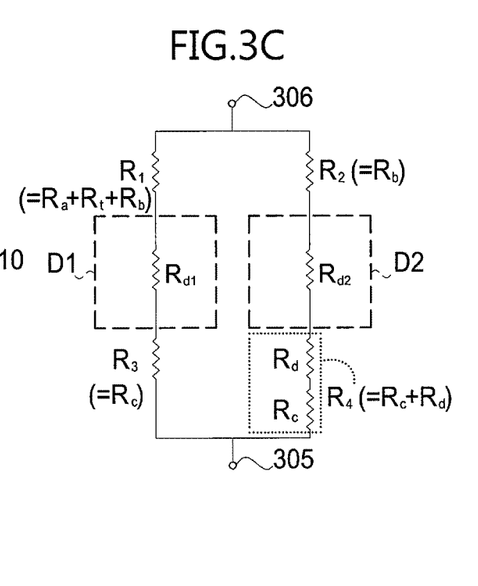
FIG. 3C shows the equivalent resistance model of the light-emitting device shown in FIG. 3A (or 3B).

FIG. 3C shows an equivalent resistance model of the light-emitting device 30 shown in FIG. 3B. The equivalent resistance model of the light-emitting device 30 is derived from the resistance of each part of the light-emitting device 30 and current flow paths between the two electrodes 305, 306 shown in FIG. 3B. When an external power source is supplied to the light-emitting device 30 from the two electrodes 305, 306, the current (/holes) is (are) supplied from the second electrode 306 to the second block 321b. Because the first trench 307 divides the transparent conductive layer 321 into the first block 321a and the second block 321b, the supplied current is divided into two paths. In one current path, the current flows through the second block 321b, the connecting layer 322, and the first block 321a sequentially, and then the current flows into a portion of the light-emitting stack 310 which is substantially under the first block 321a, and finally the current flow through a portion of the first conductivity type contact layer 311 (with a resistance Re) to the first electrode 305. In the other current path, the current flows through the second block 321b, and then the current flows directly into the portion of the light-emitting stack 310 substantially under the second block 321b, and the current flows through substantially the whole first conductivity type contact layer 311 (with a resistance Rc+Rd), and finally the current flow to the first electrode 305. Thus, the light-emitting device 30 is divided into two diodes in the equivalent circuit model. One is the portion of the light-emitting stack 310 which is substantially under the first block 321a, and the other is the portion of the light-emitting stack 310 substantially under the second block 321b, as marked by rectangles D1 and D2, respectively. The two diodes D1 (with an internal resistance Rd1) and D2 (with an internal resistance Rd2) form two light-emitting diodes in parallel connection between the first electrode 305 and the second electrode 306.

The resistance for each part of the light-emitting device 30 is shown by a resistor. For example, the resistance for a portion of the first conductivity type contact layer 311 which is substantially under the first block 321a is indicated by a resistor Rc, and the resistance for a portion of the first conductivity type contact layer 311 which is substantially under the second block 321b is indicated by a resistor Rd. The equivalent resistance model of the light-emitting device 30 is therefore shown as FIG. 3C.

The first block 321a, the second block 321b, and the connecting layer 322 form a resistor R1 (and R1=Ra+Rt+Rb) serially connected with the diode D1 and the second electrode 306. The second block 321b forms a resistor R2(=Rb) serially connected with the diode D2 and the second electrode 306. A resistor R3(=Rc) is serially connected with the diode D1 and the first electrode 305. In addition, as the first electrode 305 does not comprise any extending electrode, for the diode D2, the current flows through substantially the whole first conductivity type contact layer 311 (with a resistance Rc+Rd) before entering the first electrode 305. That is, a resistor R4(=Rc+Rd) is substantially in serial connection with the diode D2 and the first electrode 305. When the total serial resistance for the respective current paths through the two diodes D1 and D2 are compared, obviously, the resistor R1(=Ra+Rt+Rb) for the current path through the diode D1 is larger than the resistor R2(=Rb) for the current path through the diode D2. However, the resistor R3(=Rc) for the current path through the diode D1 is smaller than the resistor R4(=Rc+Rd) for the current path through the diode D2. The person of ordinary skill in the art therefore can modify the structure of the light-emitting device 30 so that the respective total serial resistances for the two current paths through the diodes D1 and D2 are substantially the same. Because the two diodes D1 and D2 form two light-emitting diodes in parallel connection between the first electrode 305 and the second electrode 306, a current flow through the diode D1 is substantially equal to that through the diode D2, that is, a current flow through the portion of the light-emitting stack 310 which is substantially under the first block 321a is substantially equal to a current flow through the portion of the light-emitting stack 310 substantially under the second block 321b. This solves the current crowding problem and brings a uniform light emission and high luminous efficiency. The modification of the structure of the light-emitting device 30 can be, for example, through the selection of the materials or the dimensions of the first block 321a, the second block 321b, and the connecting layer 322.

As the above illustration, this embodiment is useful to solve the current crowding problem when the light-emitting device comprises a rectangular shape from the top view, and especially useful when the first electrode is disposed substantially at one end along the longitudinal direction of the rectangle, as shown in FIG. 3A. It is useful to solve the current crowding problem when a ratio of the length to the width of the rectangle is not smaller than 2. As shown in FIG. 3A, the first block 321a and the second block 321b are arranged along the longitudinal direction of the rectangle, and the connecting layer 322 is extending along the longitudinal direction of the rectangle in this embodiment.

Figure 4A:
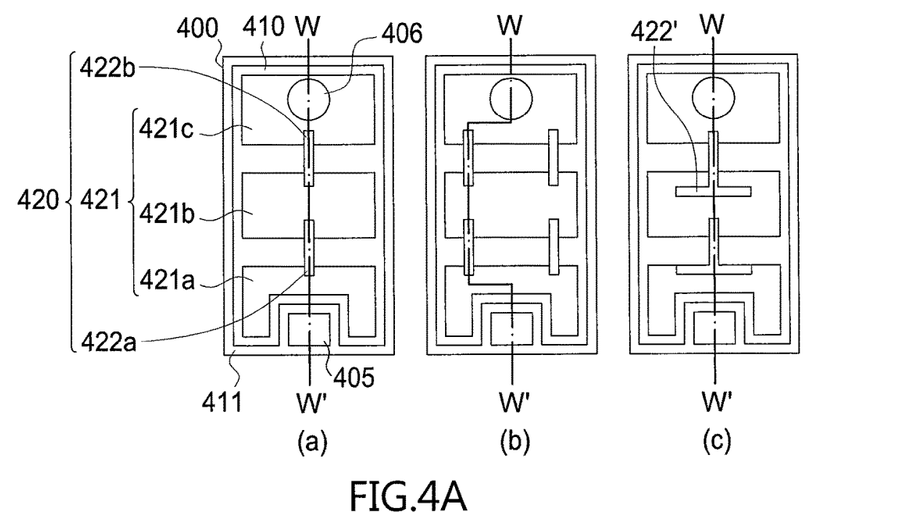
FIG. 4A is the top view.
Figure 4B:
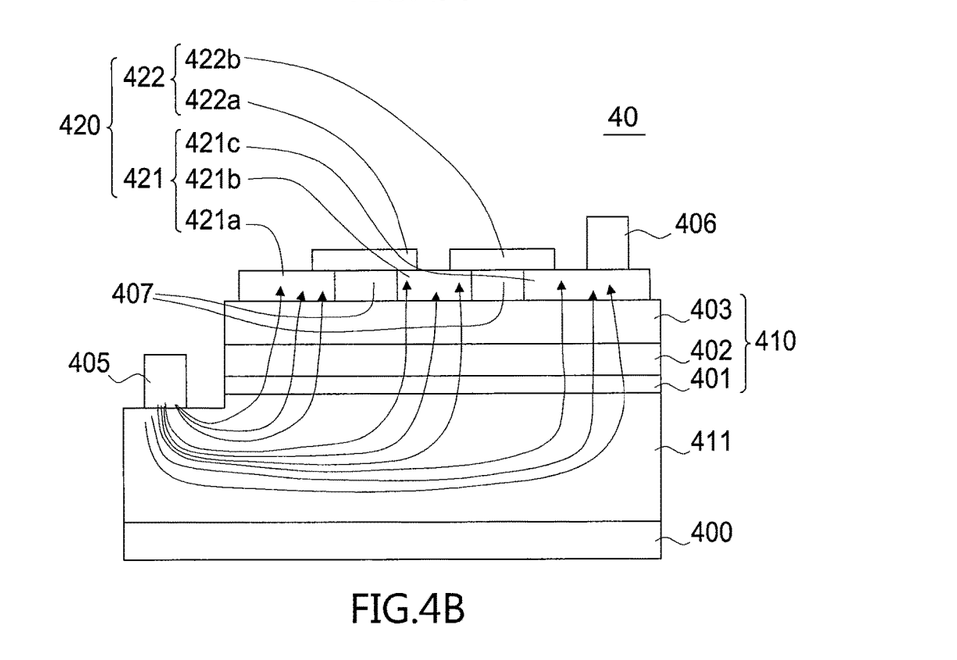
FIG. 4B is the cross-sectional view along the line W-W'.

For a light-emitting device comprising a longer rectangle, that is, a rectangle with a higher ratio of the length to the width, the above first embodiment can be employed by analogy to divide the transparent conductive layer 321 into more blocks, and the whole light-emitting stack 310 is divided into more than two portions to form more diodes in the equivalent circuit model, wherein each of which constitutes a current path between the two electrodes. FIG. 4 illustrates the second embodiment of present application. FIG. 4A is the schematic structure diagram in the top view, and FIG. 4B is the cross-sectional view along the line W-W'. Three different top view layouts: (a), (b), and (c) are provided in FIG. 4A, and the cross-sectional views cut along the W-W' line for each layouts are the same and shown as FIG. 4B. The element corresponding to the same element in FIG. 3 is labeled with the same label code except that the first digit is changed from "3" to "4". For example, element 400 in FIG. 4 is a substrate corresponding to the substrate 300 in FIG. 3. Other elements are a light-emitting stack 410, a first conductivity type semiconductor layer 401, an active layer 402, a second conductivity type semiconductor layer 403, and a first conductivity type contact layer 411. The light-emitting device 40 is substantially the same as the light-emitting device 30 shown in FIG. 3, except that the transparent conductive layer 421 of the conductive structure 420 comprises one more block than the light-emitting device 30 does. That is, the transparent conductive layer 421 comprises three blocks, which is the first block 421a, the second block 421b, and the third block 421c. In this embodiment, the connecting layer 422 comprises two segments 422a and 422b. The first trench 407 is formed between every two adjacent blocks of the transparent conductive layer 421. So in this embodiment, the light-emitting device 40 is divided into three portions to form three parallel-connected diodes in the equivalent circuit model, and each of which constitutes a current path between electrodes 405, 406 as shown in FIG. 4B. As previous illustration in FIG. 3, it is easy for the person of ordinary skill in the art to modify the structure of the light-emitting device 40 so that the current flows through the three paths are substantially equal. It is noted that it is possible for the person of ordinary skill in the art to make some changes for the connecting layer 422. As shown in the (b) layout in FIG. 4A, the connecting layer 422 may comprise more than one segment between every two adjacent blocks of the transparent conductive layer 421 to electrically connect the two adjacent blocks. As shown in the (c) layout in FIG. 4A, the connecting layer 422 may further comprise a secondary segment 422' along a direction different from the longitudinal direction. In this embodiment, the secondary segment 422' is substantially perpendicular to the segment 422 at the joint. In other embodiment, the shape of the secondary segment 422' may comprise a curve.

Figure 5A:
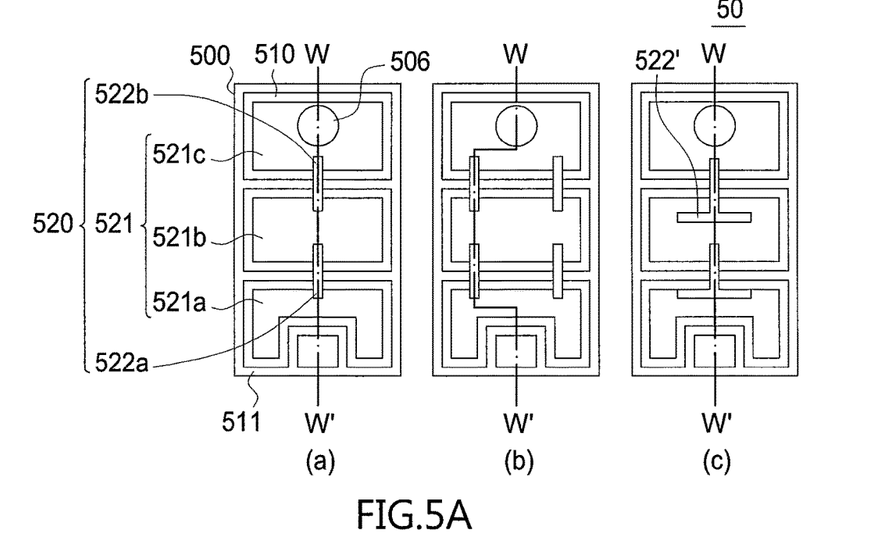
FIG. 5A is the top view.
Figure 5B:
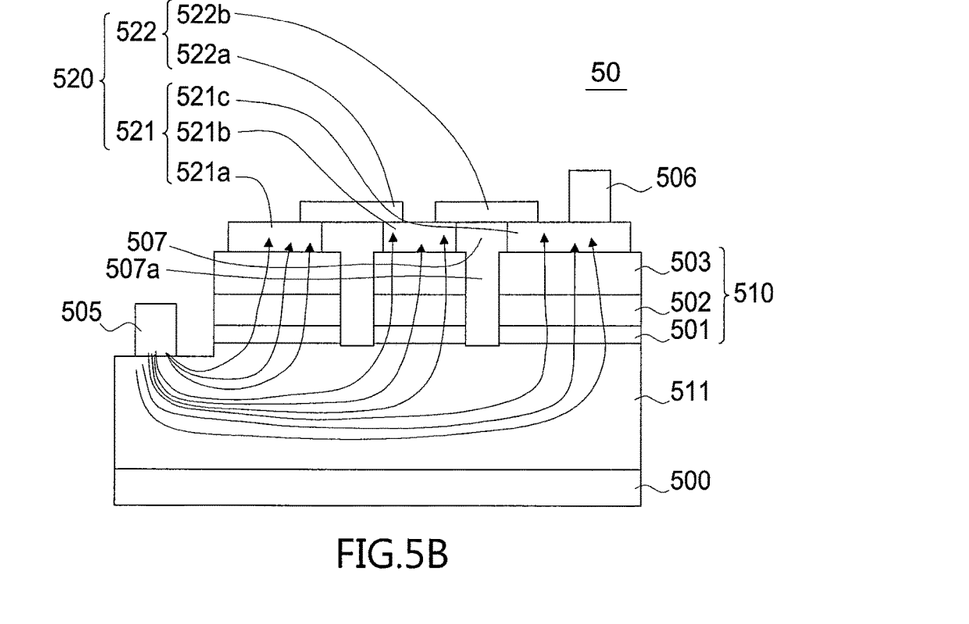
FIG. 5B is the cross-sectional view along the line W-W'.

FIG. 5 illustrates the top view of the third embodiment of present application, and FIG. 5B is the cross-sectional view. Three different top view layouts: (a), (b), and (c) are provided in FIG. 5A, and the cross-sectional views cut along the W-W' line for each layouts are the same and shown in FIG. 5B. The element corresponding to the same element in FIG. 4 (or FIG. 3) is labeled with the same label code except that the first digit is changed from "4" to "5". For example, element 500 in FIG. 5 is a substrate corresponding to the substrate 400 in FIG. 4 (or the substrate 300 in FIG. 3.). Other elements are a conductive structure 520, a connecting layer 522, two segments 522a and 522b, and a secondary segment 522'. The light-emitting device 50 is substantially the same as the light-emitting device 40 shown in FIG. 4, except that there is a second trench 507a under the first trench 507. The second trench 507a extends downward and through the light-emitting stack 510 and divides the light-emitting stack into three portions: a first portion substantially under the first block 521a, a second portion substantially under the second block 521b, and a third portion substantially under the third block 521c. Each portion comprises the first conductivity type semiconductor layer 501, the active layer 502 over the first conductivity type semiconductor layer 501, and the second conductivity type semiconductor layer 503 over the active layer 502. The three portions form three diodes in parallel connection and are disposed between the first electrode 505 and the second electrode 506. The second trench 507a may be formed before or after forming the transparent conductive layer 521. When the second trench 507a is formed after the transparent conductive layer 521 is formed, only one etch mask (ex. photo-resistor) is used, and the second trench 507a and the first trench 507 can be formed substantially at the same time by one etching process. A mesa etch process can also be performed to expose a part of the first conductivity type contact layer 511 simultaneously with the formation of the trenches. In another embodiment, the second trench 507a is formed by a first etching process with a first etch mask (ex.

photo-resistor). Next, the transparent conductive layer 521 is formed while part of the transparent conductive layer 521 fills into the second trench 507a. Afterwards, another etch mask (photo-resistor) is formed on the transparent conductive layer 521, and a second etching process is performed to form the first trench 507 and remove part of the transparent conductive layer 521 that fills into the second trench 507a. Similarly, a mesa etch process can also be performed to expose a part of the first conductivity type contact layer 511 with the first etching process simultaneously.

Figure 6:
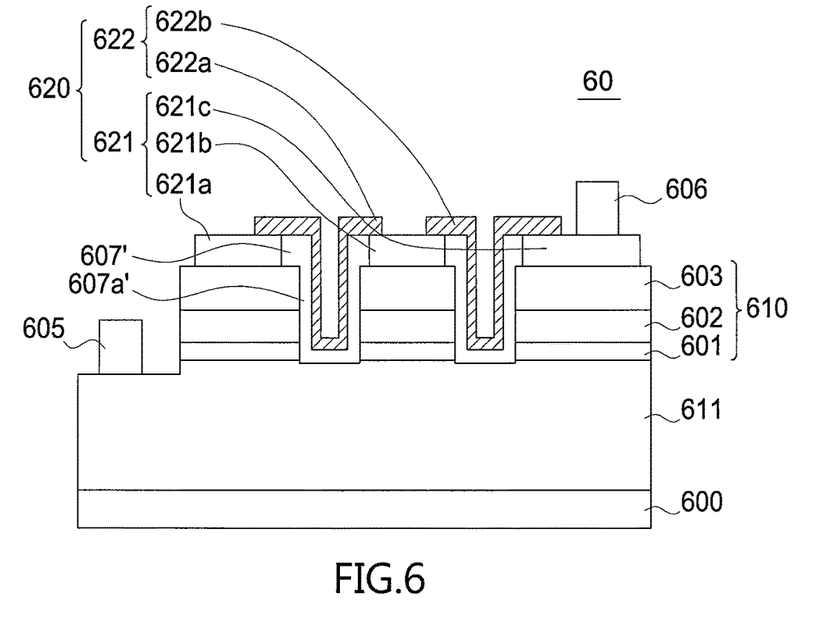
FIG. 6 is a cross-sectional view along the line W-W' in FIG. 5A of the light-emitting diode in accordance with the fourth embodiment of the present application.

FIG. 6 illustrates the fourth embodiment of present application, which is a modification of the third embodiment. FIG. 6 shows the cross-sectional view along the line W-W' in FIG. 5A, and is corresponding to the cross-sectional view of FIG. 5B. The element corresponding to the same element in FIG. 5B is labeled with the same label code except that the first digit is changed from "5" to "6". For example, element 600 in FIG. 6 is a substrate corresponding to the substrate 500 in FIG. 5B. Other elements are a first conductivity type contact layer 611, a first conductivity type semiconductor layer 601, an active layer 602, a second conductivity type semiconductor layer 603, a first electrode 605, a second electrode 606, a conductive structure 620, a transparent conductive layer 621, a first block 621a, a second block 621b, a third block 621c, and two segments 622a and 622b. The light-emitting device 60 is substantially the same as the light-emitting device 50 shown in FIG. 5, except that the trenches and the connecting layer are modified. In this embodiment, as FIG. 6 shows, the non-conductive material layer comprising the first part 607' formed in the first trench and the second part 607a' formed in the second trench is a film structure conformal to the profile of the first trench and the second trench. That is, the non-conductive material does not completely fill the trenches, and the connecting layer 622 is also formed to be a film conformal to the profile of the non-conductive material.

Though the embodiments described above are illustrated by a horizontal type LED and specific materials, it will be apparent that other alternatives, modifications and materials may be made to the embodiments without escaping the spirit and scope of the application.

What is claimed is:
1. A light-emitting device, comprising:
a substrate;
a light-emitting stack comprising a first conductivity type semiconductor layer, an active layer over the first conductivity type semiconductor layer, and a second conductivity type semiconductor layer over the active layer;
a transparent conductive layer over the light-emitting stack;
a first trench dividing the transparent conductive layer into a first block and a second block;
a second trench under the first trench and dividing the light-emitting stack into a first portion and a second portion, wherein each of the first portion and the second portion comprises a portion of the first conductivity type semiconductor layer, a portion of the active layer and a portion of the second conductivity type semiconductor layer, and the first portion and the second portion form parallel connection;
a connecting layer electrically connecting the first and the second blocks of the transparent conductive layer;
a first conductivity type contact layer between the substrate and the first conductivity type semiconductor layer;
a first electrode over and directly contacting the first conductivity type contact layer and electrically connected to the first conductivity type semiconductor layer, wherein the first electrode is devoid of extending to the second trench from a top view of the light-emitting device; and
a second electrode, wherein the second electrode and the transparent conductive layer locate on the same side of the second conductivity type semiconductor layer, and the second electrode is separated from the connecting layer.

2. The light-emitting device as claimed in claim 1, wherein the first electrode is devoid of any finger-type electrode.

3. The light-emitting device as claimed in claim 1, wherein a shape of the light-emitting device from its top view is a rectangle having a longitudinal direction, and the first electrode is disposed near one end of the longitudinal direction of the rectangle.

4. The light-emitting device as claimed in claim 3, wherein a ratio of a length to a width of the rectangle is not smaller than 2.

5. The light-emitting device as claimed in claim 3, wherein the first block and the second block are arranged along the longitudinal direction of the rectangle.

6. The light-emitting device as claimed in claim 3, wherein the connecting layer comprises a first segment along the longitudinal direction.

7. The light-emitting device as claimed in claim 6, wherein the connecting layer further comprises a secondary segment along a direction different from the longitudinal direction.

8. The light-emitting device as claimed in claim 7, wherein the secondary segment is perpendicular to the first segment at a joint.

9. The light-emitting device as claimed in claim 7, wherein a shape of the secondary segment comprises a curve.

10. The light-emitting device as claimed in claim 1, wherein the second electrode comprises the same material as that of the connecting layer.

11. The light-emitting device as claimed in claim 1, wherein the transparent conductive layer comprises transparent conductive oxide.

12. The light-emitting device as claimed in claim 1, further comprising a non-conductive material filled in the first trench, and the non-conductive material comprises $SiN_x$, $SiO_x$, or SOG.

13. The light-emitting device as claimed in claim 1, wherein a first current flow through the first portion is equal to a second current flow through the second portion when driving the light-emitting device.

14. The light-emitting device as claimed in claim 1, wherein the connecting layer comprises a conductivity different from a conductivity of the transparent conductive layer.

15. The light-emitting device as claimed in claim 14, wherein the conductivity of the connecting layer is larger than the conductivity of the transparent conductive layer.

16. The light-emitting device as claimed in claim 1, wherein the first portion is under the first block and the second portion is under the second block.

17. The light-emitting device as claimed in claim 1, wherein a shape of the first trench and a shape of the second trench in a cross section of the light-emitting device are different.

18. The light-emitting device as claimed in claim 1, wherein the first trench comprises a first width along a horizontal direction perpendicular to a stacking direction of the first conductivity type semiconductor layer, the active layer and the second conductivity type semiconductor layer from a cross section view of the light-emitting device, and the second trench comprises a second width along the horizontal direction perpendicular to the stacking direction from the cross section view of the light-emitting device, and the first width is larger than the second width.

19. The light-emitting device as claimed in claim 1, wherein the first conductivity type contact layer is exposed by the second trench.

* * * * *